US009538693B2

(12) United States Patent
Kurz et al.

(10) Patent No.: US 9,538,693 B2

(45) Date of Patent: Jan. 3, 2017

(54) ALUMINUM EMI / RF SHIELD

(71) Applicant: A.K. Stamping Company, Inc., Moutainside, NJ (US)

(72) Inventors: Arthur Kurz, New Vernon, NJ (US); Michael Schneider, Montgomery, NJ (US); Bret Barry, Fincastle, VA (US)

(73) Assignee: A.K. Stamping Company, Inc., Mountainside, NJ (US)

( * ) Notice: Subject to any disclaimer, the term of this patent is extended or adjusted under 35 U.S.C. 154(b) by 139 days.

(21) Appl. No.: 14/210,561

(22) Filed: Mar. 14, 2014

(65) Prior Publication Data

US 2014/0307392 A1 Oct. 16, 2014

Related U.S. Application Data

(60) Provisional application No. 61/788,151, filed on Mar. 15, 2013.

(51) Int. Cl.

*H05K 9/00* (2006.01)
*H05K 7/20* (2006.01)
*H01L 23/367* (2006.01)
*H01L 23/552* (2006.01)

(52) U.S. Cl.

CPC ......... *H05K 9/0026* (2013.01); *H01L 23/3672* (2013.01); *H01L 23/552* (2013.01); *H05K 7/2039* (2013.01); *H05K 9/0032* (2013.01); *H01L 2924/0002* (2013.01)

(58) Field of Classification Search

CPC .. H05K 9/0026; H05K 7/2039; H05K 9/0032; H01L 23/552; H01L 23/3672; H01L 2924/0002

USPC ..... 361/688–723, 814, 816, 818; 324/750.27

See application file for complete search history.

(56) References Cited

U.S. PATENT DOCUMENTS 5,614,694 A 3/1997 Gorenz, Jr. et al.
5,761,053 A * 6/1998 King .................... H01L 23/552 174/377
6,178,096 B1 1/2001 Flickinger et al.
6,178,097 B1 1/2001 Hauk, Jr.
6,180,876 B1 1/2001 Holmes
6,219,239 B1 * 4/2001 Mellberg .............. H05K 9/002 165/80.3
6,384,324 B2 * 5/2002 Flegeo .................... H02B 1/30 174/374
6,426,881 B1 * 7/2002 Kurz .................... H05K 9/0016 174/366
6,501,016 B1 * 12/2002 Sosnowski ........... H05K 9/0032 174/382
6,831,224 B2 12/2004 Koivusilta (Continued)

OTHER PUBLICATIONS

Office Action dated Apr. 6, 2016, issued in connection with U.S. Appl. No. 14/735,437 (11 pages).

*Primary Examiner* — Anthony Haughton
*Assistant Examiner* — Yahya Ahmad
(74) *Attorney, Agent, or Firm* — McCarter & English, LLP

(57) ABSTRACT

A shield made from aluminum (AL) or an aluminum-based alloy coated with a solderable plating such as nickel or tin provides thermal improvement over existing shielding materials. The shield for circuitry on a circuit board comprising an aluminum material plated with a solderable material, the shield providing electromagnetic interference and radio frequency interference shielding and heat transfer when positioned over a circuit.

10 Claims, 4 Drawing Sheets

(56) References Cited

U.S. PATENT DOCUMENTS 6,870,091 B2 3/2005 Seidler
6,897,371 B1 5/2005 Kurz et al.
6,903,262 B2 6/2005 Blersch
7,006,361 B2 * 2/2006 Hosokawa ........... B41J 2/17596 361/760
7,113,410 B2 9/2006 Pawlenko et al.
7,119,286 B1 10/2006 Horng
7,208,675 B2 4/2007 Horng
7,488,901 B2 2/2009 Arnold
7,544,885 B2 6/2009 Horng
7,580,270 B2 8/2009 Iikubo et al.
7,724,542 B2 5/2010 Gallahan et al.
7,830,672 B1 * 11/2010 Kitchen ............... A45C 11/182 174/350
7,961,479 B2 6/2011 Wang
8,383,960 B2 2/2013 Kurz et al.
2002/0064024 A1 * 5/2002 McCullough ........... G06F 1/203 361/679.54
2002/0101720 A1 * 8/2002 Kline .................. H01L 23/3675 361/704
2002/0139552 A1 * 10/2002 Chang .................. H05K 9/0026 174/382
2003/0151906 A1 * 8/2003 Schaffer .............. H01L 23/3677 361/818
2003/0223212 A1 * 12/2003 Hosokawa ........... B41J 2/17596 361/816
2004/0052064 A1 * 3/2004 Oliver ................. H01L 23/4093 361/816
2004/0190260 A1 * 9/2004 Sasaki ....................... F28F 3/02 361/704
2005/0116145 A1 * 6/2005 Aki ....................... H01L 23/552 250/214.1
2005/0121212 A1 6/2005 English et al.
2006/0002099 A1 1/2006 Stoneham et al.
2006/0272857 A1 12/2006 Arnold
2007/0210082 A1 * 9/2007 English ................ H05K 9/0032 220/4.21
2007/0211436 A1 * 9/2007 Robinson .............. H01L 23/552 361/719
2008/0158849 A1 * 7/2008 Gallahan .............. H05K 9/0032 361/818
2008/0179086 A1 7/2008 English et al.
2011/0026194 A1 * 2/2011 Riggsby ................. H05K 5/066 361/679.01
2011/0162879 A1 * 7/2011 Bunyan ................. H01L 23/552 174/378
2011/0176279 A1 * 7/2011 Zhao ................... H01L 21/4878 361/720
2011/0266045 A1 11/2011 Xiong et al.
2011/0310562 A1 * 12/2011 Strader .............. H05K 7/20472 361/704
2012/0000625 A1 1/2012 Tan
2012/0015127 A1 * 1/2012 Kurz .................... H05K 9/0026 428/43
2013/0048369 A1 * 2/2013 Malek .................. H05K 9/0032 174/377
2014/0071635 A1 * 3/2014 Werner .................... H05K 3/30 361/748
2014/0078677 A1 * 3/2014 Dolci ...................... H01L 23/10 361/719
2015/0282393 A1 10/2015 Kurz et al.
2016/0100511 A1 4/2016 Kurz et al.

* cited by examiner

ALUMINUM EMI / RF SHIELD

CROSS-REFERENCE TO RELATED APPLICATION

This application claims priority to U.S. Provisional Patent Application No. 61/788,151 filed on Mar. 15, 2013, which is incorporated herein by reference in its entirety

BACKGROUND

Field

The present disclosure relates to an EMI/RF shield for circuitry on a circuit board and more particularly an EMI/RF shield comprised of aluminum or an aluminum-based alloy and plated with a solderable material.

Related Art

Traditional EMI/RF shielding materials include but are not limited to nickel silver, tin plated cold rolled steel or SPTE, stainless steel, brass, or phosphor bronze materials which are good for formability and EMI/RF shielding but are poor from a thermal performance perspective or cost prohibitive for a shielding application.

One piece shields are typically used on thin devices where the height is a concern and replaceable lids cannot be used due to height restrictions. One piece shields are also used for cost saving solutions when compared to two piece shields. Two piece shielding solutions are generally used for reworkability and testing, and are typically higher cost.

SUMMARY

A shield made from aluminum (AL) or an aluminum-based alloy coated with a solderable plating such as nickel or tin provides thermal improvement over existing shielding materials. Plated aluminum offers enhanced thermal performance while also offering a significant weight reduction when compared to commonly used shielding materials. Aluminum in its raw form is not a solderable material but can be pre-processed and/or post-processed with a solderable plating allowing the shield to be soldered directly to a circuit board. The aluminum-based shield helps spread heat generated from a device (IC) across the top surface of the EMI lid flattening out “hot spots.” Due to the higher thermal conductivity of aluminum and the ability to solder the shield directly to the board, the shield will also transfer heat from the top surface down the shield side walls and “dump” the heat into the circuit board. Circuit boards constructed using layers of copper traces will transfer heat away from the device offering a lower operating temperature improving device life and reliability.

BRIEF DESCRIPTION OF THE DRAWINGS

The foregoing features will be apparent from the following Detailed Description, taken in connection with the accompanying drawings, in which.

DETAILED DESCRIPTION

An EMI/RF shield is made of aluminum or an aluminum-based alloy to take advantage of the thermal performance of aluminum. To allow for soldering, the aluminum material is plated with a solderable material such as nickel or tin.

Figure 1:
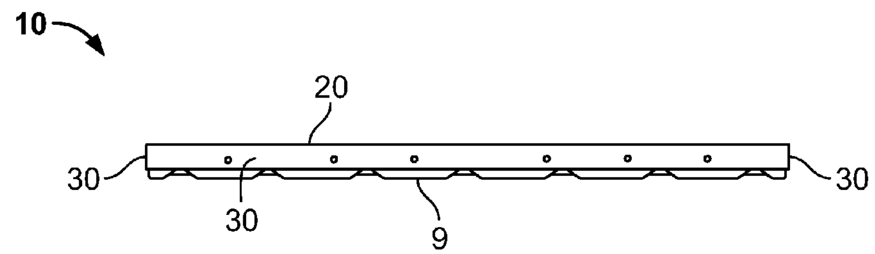
FIG. 1 is a side view of a two-piece EMI/RF shield consisting of a fence and lid.

FIG. 1 is a side view of a heat shield made of aluminum or an aluminum-based alloy, generally indicated at 10. The shield lid 10 is attached to a fence 9 which is attached to a circuit board and surrounds circuitry. Other ways of attachment of the shield 10 to a circuit board circuitry are considered to be written within the scope of this disclosure. The shield 10 includes an upper surface 20 and may include one or more side walls 30, forming a lid that can be positioned over a circuit to provide for electromagnetic interference and radio frequency shielding. For example, the shield could have four walls and a top wall to form a five-sided lid. A benefit of using aluminum or an aluminum-based alloy is the enhanced thermal performance and weight reduction as compared to other shielding materials. Because of the thermal conductivity of the aluminum, the shield transfers heat from the top surface down the side walls of the shield and can dump the heat into the circuit board where it is dissipated.

Figure 2:
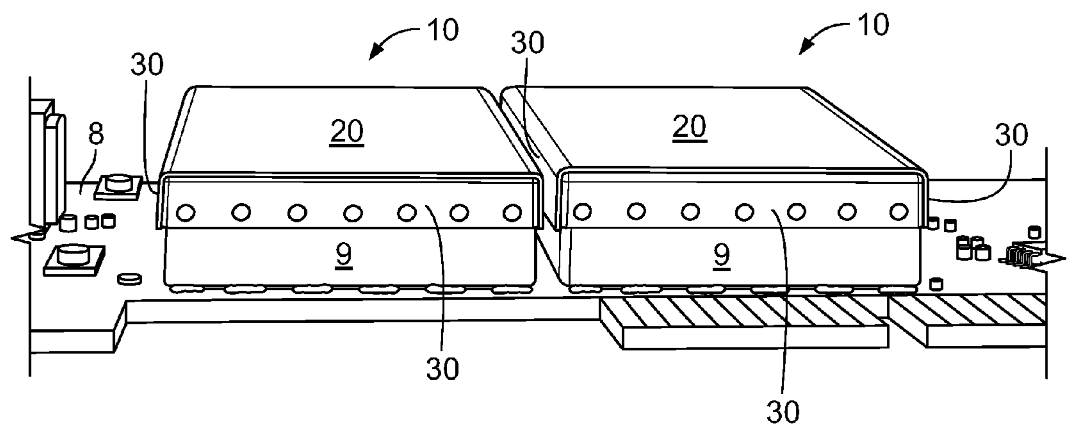
FIG. 2 is a perspective view showing two two-piece EMI/RF shields each with a lid attached to a fence around circuitry on a board.

FIG. 2 is a perspective view showing two fences 9 on a circuit board 8 with shields lids 10 attached to the fences 9. All of the shields discussed herein could be one or two piece shields that could be attached to circuit boards by attachment to fences or in other ways known in the art. The shield can be attached to the fencing in any way known in the art, such as by soldering. The attachment can be snap down or as otherwise know in the art. The shields 10 include top wall 20 and side walls 30. The shields lids 10 are made of an aluminum or aluminum-based alloy plated with a solderable material such as nickel or tin. The fence 9 can be made of aluminum or an aluminum-based alloy plated with a solderable material such as nickel or tin to permit soldering of the shield. The aluminum containing shields disclosed herein can be manufactured in accordance with what is known in the art in connection with manufacturing shields of conventional shielding materials. The aluminum material can be plated with nickel, tin or another solderable material before or after being formed into a lid configuration.

Figure 3:
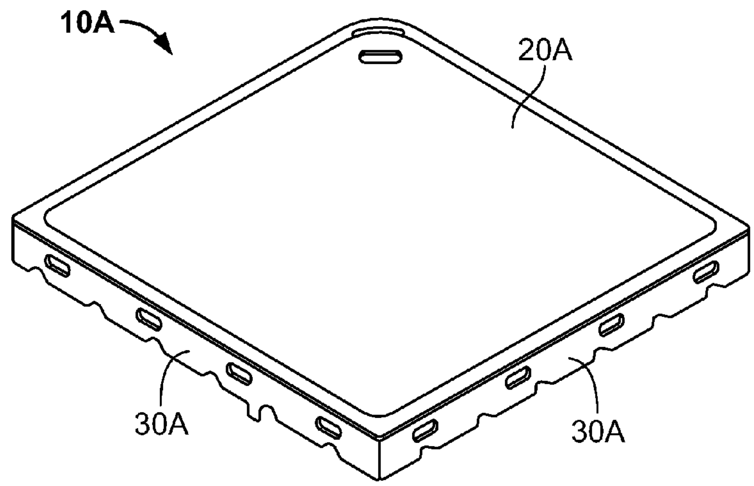
FIG. 3 is a perspective view showing a one piece reworkable shield that can be attached directly to a circuit board.

FIG. 3 is a perspective view showing a one piece reworkable shield 10A that could be made of aluminum or an aluminum-based alloy that can be attached directly to a circuit board. The shield 10A includes top wall 20A and side walls 30A. The shield 10A is made of aluminum or an aluminum-based alloy plated with a solderable material such as nickel or tin to permit soldering of the shield directly to the circuit board. The fence 9 are made of aluminum or an aluminum-based alloy plated with a solderable material such as nickel or tin to permit soldering of the shield. The aluminum containing shields disclosed herein can be manufactured in accordance with what is known in the art in connection with manufacturing shields of conventional shielding materials. The aluminum material can be plated with nickel, tin or another solderable material before or after being formed into a configuration with side walls. The shield could be peelable or non-peel. If it is a peel shield and if it is re-worked and the lid is removed, the fence is left behind attached to the board requiring a replacement lid that snaps on the existing fence.

Figure 4:
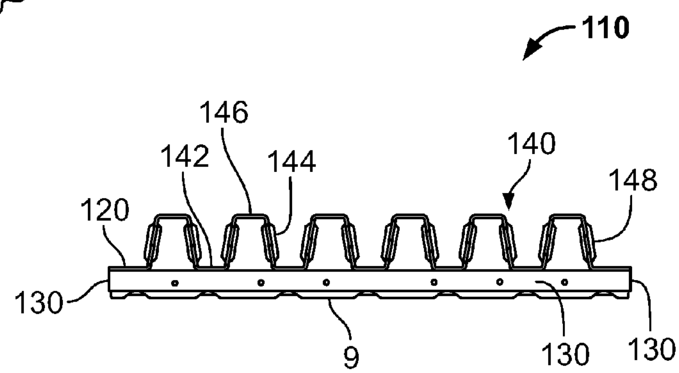
FIG. 4 is a side view of another EMI/RF shield with heat dissipating fins attached to the shield.

FIG. 4 shows a shield generally indicated at 110 attached to a fence 9. The shield has a top wall 120 and may have one or more side walls 130. The shield includes heat dissipating fins generally indicated at 140 attached to the top wall. The fins 140 can be soldered to the top wall 120 of the shield 110. The fins can be made of the same material as the shield, e.g. aluminum or an aluminum-based alloy that can be plated with nickel, tin or other solderable material. Of course the fins can be made of an entirely different material than the shield, such as a conventional non-aluminum material, if desired. The fins can be shaped as desired in accordance with what is known in the art. The fins could be plated with a solderable material before or after the fins are shaped into final form. As shown in FIG. 4, fins 140 can have a series of valleys 142 for contact to and solderable connection with the top wall 120 of shield 110. The fins 140 can have a plurality of upstanding walls 144 and tops 146 connected between upstanding walls. Upstanding walls 144 can have further heat dissipating features such as further fins 148 to provide greater surface area for increased heat dissipation.

Figure 5:
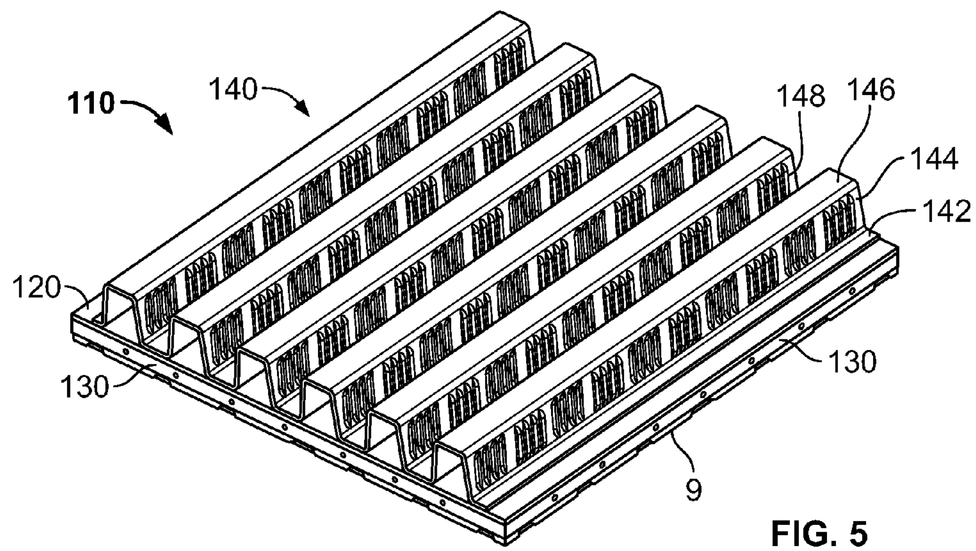
FIG. 5 is a perspective view of the shield shown in FIG. 4.

FIG. 5 is a perspective view of the shield with fins shown in FIG. 4. As discussed with respect to FIG. 3, the shield 110 includes a top 120 and may include side walls 130. The shield 110 is attached to fence 9 on a circuit board. Fins 140 include a series of valleys 142 wherein the fins 140 can be soldered to the top wall 120, a plurality of upstanding walls 144 and a plurality of top surfaces 146 which interconnect adjacent upstanding walls 144. Further, upstanding walls 144 may include further heat dissipation features such as additional fins 148.

Figure 6:
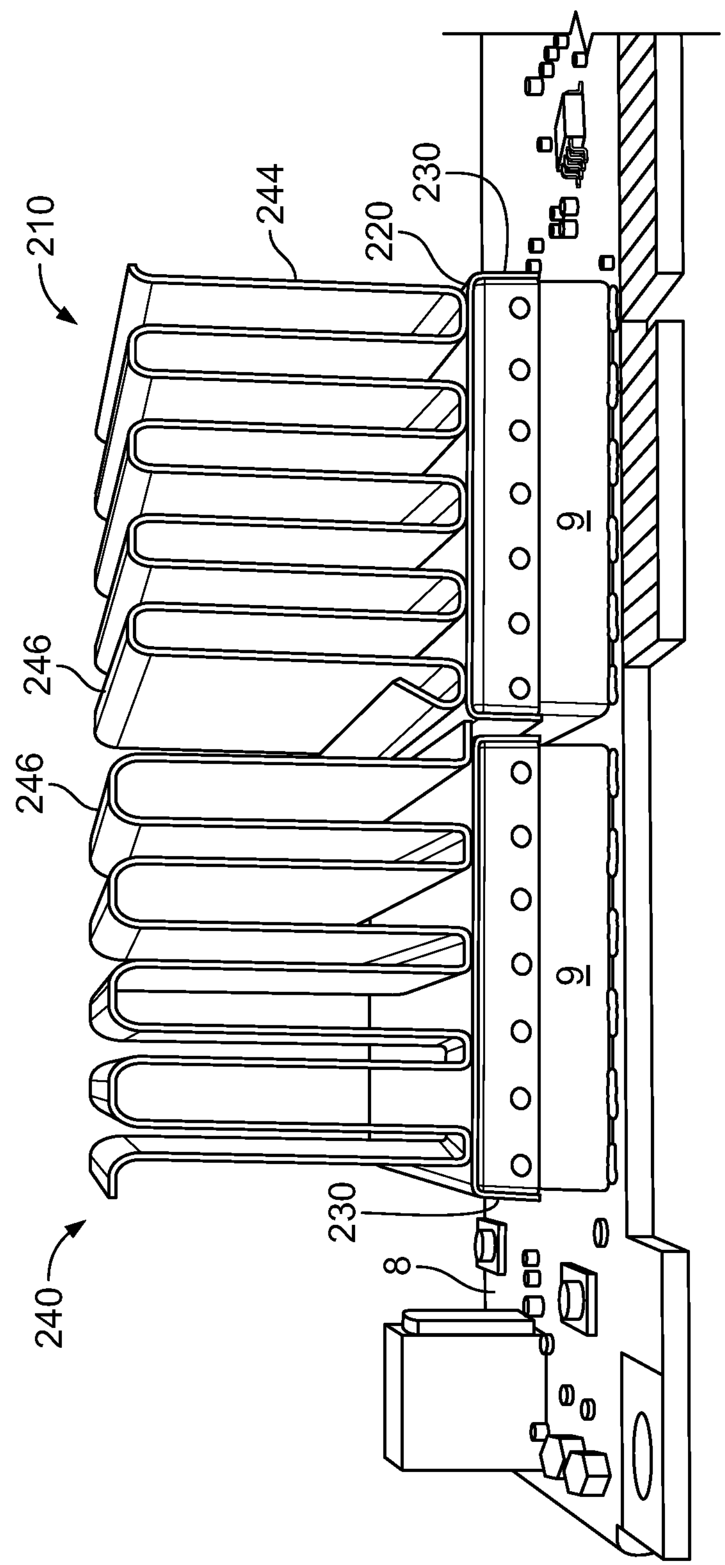
FIG. 6 is a perspective view of an EMI/RF shield with heat fins thereon.

FIG. 6 is a perspective view of another aluminum or aluminum-based shield with fins. The shields 210 includes a top wall 220 and may include side walls 230. The shields 210 are attached to fences 9 on a circuit board 8. Fins 240 include a series of valleys 242 that can be soldered to the top wall 220, a plurality of upstanding walls 244 and a plurality of top surfaces 246 which interconnect adjacent upstanding walls 244. As shown, the upstanding walls 244 can be configured to extend at right angles with respect to the top wall 220.

Figure 7:
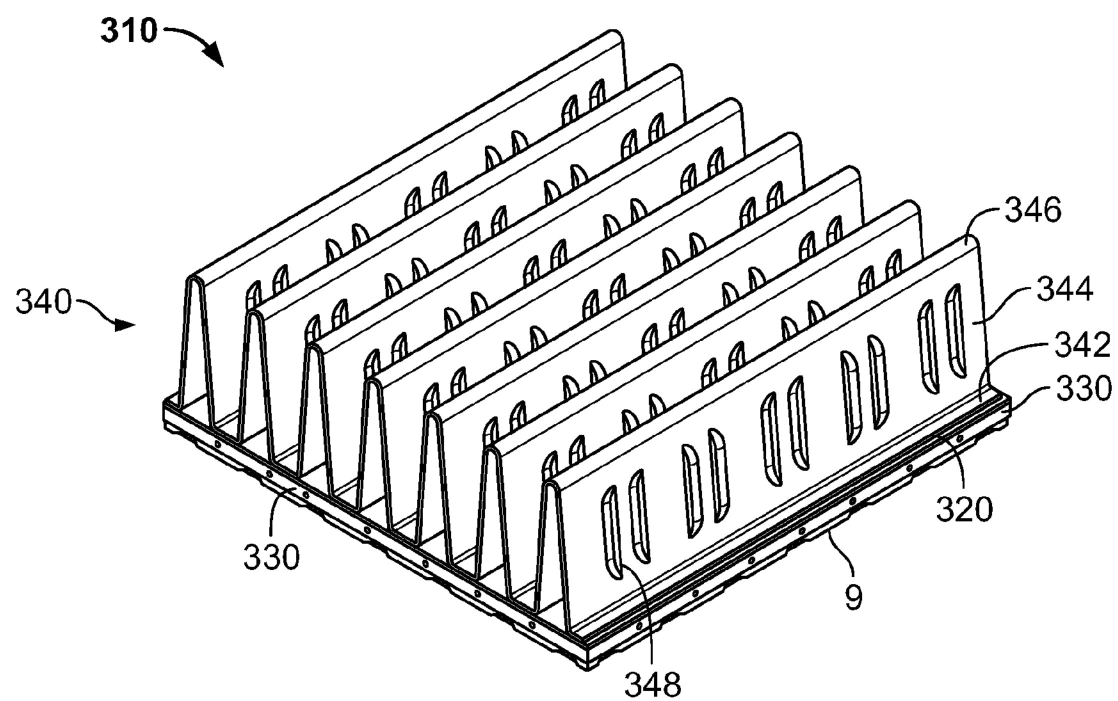
FIG. 7 is a perspective view of a EMI/RF shield with heat fins thereon.

FIG. 7 is a perspective view of another aluminum or aluminum-based shield with fins. The shield 310 includes a top wall 320 and may include side walls 330. The shield 310 is attached to fence 9 on a circuit board. Fins 340 include a series of valleys 342 wherein the fins 340 can be soldered to the top wall 320, a plurality of upstanding walls 344 and a plurality of top surfaces 346 which interconnect adjacent upstanding walls 344. As shown, the upstanding walls 344 of fins 340 can be configured to extend from the top wall at an angle other than a right angle from the top wall 320. Further, upstanding walls 344 may include further heat dissipation features such as additional fins 348.

The shields disclosed herein can be: single piece shields that are non-peelable or non-reworkable; single piece shields that are peelable/reworkable; two piece shields including a fence and lid both made using plated aluminum; two piece shields including a fence and lid, one component of which is plated aluminum (typically the lid) (the fence could use nickel silver, cold rolled steel or plated stainless steel); and two piece shields with soldered pre- or post-plated aluminum or copper (not limited to material selection) fin stock soldered to plated lid surface.

Low profile/low power devices such as mobile handsets, tablets, thin laptops may use either a one or two piece shield solution without soldered fin stock to the lid offering a thermal advantage over commonly used nickel silver and cold rolled shields.

High power applications such as RF modules, processor modules which typically are found in larger case structures (e.g. server chassis, wireless modems, set top boxes or cable boxes) which are typically force convection cooled. These devices can use plated fin stock to offer additional thermal improvement when used with the base plated aluminum fence and lid. Fin stock (formed, folded, stamped, etc.) is soldered to the top surface of the EMI/RF shield lid increasing thermal performance.

Having thus described the disclosure in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure. What is desired to be protected is set forth in the following claims.

What is claimed is:

1. A shield for a circuit board comprising:

an aluminum substrate plated with a solderable material, the substrate forming a continuous, unitary, generally planar lid with bends forming depending side walls, the side walls extending over and around a fence and frictionally engaging an outside perimeter of the fence, the fence mounted to a circuit board to engage the shield over a circuit component to shield radio frequency interference, the continuous, unitary, generally planar lid, extending over the circuit component.

2. A shield for a circuit board comprising:

an aluminum substrate plated with a solderable material, the substrate forming a generally planar lid for solderably receiving an array of fins, the lid having depending side walls, an aluminum fence plated with a solderable material soldered to a circuit board, the lid positioned on the fence, in snap down attachment with the fence, over a circuit component to shield radio frequency interference.

3. A two piece shield attached to a circuit board for providing electromagnetic interference and radio frequency interference shielding and heat transfer when positioned over a circuit, comprising:

a fence made of a first material, the fence attached to a circuit board; and a lid made of a second material, the lid plated with a solderable material, the lid removably snap down attached to the fence, the second material being aluminum.

4. The two piece shield of claim 3, wherein the second material is different than the first material.

5. A shield for attachment to a circuit board, wherein the circuit board includes circuitry, the shield comprising:

an aluminum substrate defining a continuous, unitary, generally planar top wall and a plurality of side walls depending from the top wall, wherein the top walls and side walls of the substrate are coated with a solderable material;

an aluminum fence coated with a solderable material, the side walls of the aluminum substrate in snap down engagement with the fence to define an engaged position, and in the engaged position, the top wall and side walls enclose the circuitry on the circuit board, and the aluminum substrate and solderable coating shield the circuitry from electromagnetic interference and radio frequency interference; and an aluminum conductive heat transfer path extending from the top wall and down the side walls, wherein in the engaged position, heat generated by the enclosed circuitry is transferred into the aluminum conductive heat transfer path and, in turn, into the fence and circuit board and is dissipated therein.

6. A shield as defined in claim 5, wherein the solderable material is tin or nickel.

7. A shield as defined in claim 5, wherein the solderable coating is a plating.

8. A shield as defined in claim 5, further in combination with the circuit board and circuitry to which the aluminum fence is engaged and which the aluminum substrate encloses.

9. A shield as defined in claim 5, wherein the substrate defines a planar top wall and four depending side walls.

10. A shield as defined in claim 5, wherein in the engaged position, the side walls engage an outside perimeter of the fence.

* * * * *

UNITED STATES PATENT AND TRADEMARK OFFICE

CERTIFICATE OF CORRECTION

PATENT NO. : 9,538,693 B2
APPLICATION NO. : 14/210561
DATED : January 3, 2017
INVENTOR(S) : Arthur Kurz, Michael Schneider and Bret Barry It is certified that error appears in the above-identified patent and that said Letters Patent is hereby corrected as shown below:

On the Title Page

Under the Inventors (Item (72)), Michael Schneider's state of residence should be listed as "NY"

Signed and Sealed this
Sixth Day of June, 2017

Michelle K. Lee
*Director of the United States Patent and Trademark Office*